United States Patent
Lin et al.

(10) Patent No.: US 8,228,212 B2
(45) Date of Patent: Jul. 24, 2012

(54) TOUCH-SENSITIVE DEVICE

(75) Inventors: Yu-Kai Lin, Chung Ho (TW);
Chih-Yung Chen, Chung Ho (TW);
Yi-Hung Lin, Chung Ho (TW)

(73) Assignee: KO JA (Cayman) Co., Ltd., Grand Cayman (KY)

( * ) Notice: Subject to any disclaimer, the term of this patent is extended or adjusted under 35 U.S.C. 154(b) by 594 days.

(21) Appl. No.: 12/548,859

(22) Filed: Aug. 27, 2009

(65) Prior Publication Data

US 2011/0050466 A1    Mar. 3, 2011

(51) Int. Cl.
*H03K 17/94* (2006.01)
*H03M 11/00* (2006.01)

(52) U.S. Cl. .......... 341/33; 341/34; 178/18.06; 345/173

(58) Field of Classification Search .............. 341/33–34; 345/173; 178/18.06
See application file for complete search history.

(56) References Cited

U.S. PATENT DOCUMENTS

| | | | | |
|---|---|---|---|---|
| 5,869,791 A | * | 2/1999 | Young | 178/20.01 |
| 7,948,477 B2 | * | 5/2011 | Hotelling | 345/173 |
| 8,119,937 B2 | * | 2/2012 | Yang | 178/18.06 |

FOREIGN PATENT DOCUMENTS

TW    I283830    7/2007

* cited by examiner

*Primary Examiner* — Khai M Nguyen
(74) *Attorney, Agent, or Firm* — Chun-Ming Shih; HDLS IPR Services

(57) ABSTRACT

A touch-sensitive device includes a membrane substrate, an inductive layer and a protection layer. The inductive layer, arranged on a front face of the membrane substrate, has a plurality of capacitance-inductive sections, and at least one transmission line extended from a side of each of the capacitance-inductive sections. The protection layer is arranged on a front face of the inductive layer. A capacitance variation generated from the inductive section is in turn to output a signal to an electronic object via the transmission lines. After the signal is processed by the electronic object, a specific function is then executed.

8 Claims, 5 Drawing Sheets

TOUCH-SENSITIVE DEVICE

BACKGROUND OF THE INVENTION

1. Field of the Invention

The present invention in general relates to an operational interface, in particular, to a touch-sensitive device arranged on an electronic object.

2. Description of Prior Art

It is well-known that every electronic object has an operational panel arranged thereon. Under the operational panel, push buttons are hidden. When user pushes pattern layers on the operational panel, namely, pushing the button corresponding to the pattern layer, the pushed button generates a control signal output to a motherboard of the electronic object. After the signal is processed by the motherboard, the function of the pushed button is then executed.

When the pattern layers of the operational panel are pushed, since the enacting forces are different, after a long period of usage, it frequently occurs that the materials of the pattern layers on the surface of the operational panel are broken. Or, the coating of the pattern layer is worn or unclear. Even, a mechanical failure occurs to the push button hidden under the operational panel. Due to this kind of damage of the push button, the user has to repair the electronic object or buy a new one. Furthermore, since some operational panel is restricted by the mechanism, it is impossible to reach the requirement of curved-surface requirement, because the panel of the electronic object is too flat and inflexible.

Therefore, as proposed by a Taiwan patent of I283830 and title "A Metallic Coating Panel with Touch Control Division Sections And A manufacturing Method Thereof", a panel with touch control induction is thus presented to the public. This kind of operational panel with touch control induction can make a user touch the operational panel with a light touch control manner to reduce the damaging probability. However, this kind of operational panel with touch control induction has an additional division unit that makes the manufacturing process more time- and labor-consuming. Besides, the substrate of the operational panel with contact control induction is inflexible to reach the requirement of curved-surface mechanism, because of its rigid plate structure.

Accordingly, after a substantially devoted study, in cooperation with the application of relative academic principles, the inventor has finally proposed the present invention that is designed reasonably to possess the capability to improve the drawbacks of the prior art significantly.

SUMMARY OF THE INVENTION

Therefore, in order to solve aforementioned problems, the invention is mainly to provide a touch-sensitive operational panel by means of a flexible membrane structure. Not only the possibility of the damage on the surface of the operational panel can be reduced, but also the panel is so flexible that the requirement of a curved-surface mechanism is reached.

Secondly, the invention is to provide a touch-sensitive device, arranged on an electronic object and electrically connected to a driving circuit, including:
 a membrane substrate;
 an inductive layer, which is arranged on a front face of the membrane substrate, and which has a plurality of capacitance-inductive sections, and at least one transmission line extended from a side of the capacitance-inductive section; and
 a protection layer, which is arranged on the inductive layer.

A capacitance variation generated from the inductive section is in turn to output a signal to an external driving circuit via the transmission lines. After processed by the driving circuit, the signal is again sent to the electronic object to be processed therein, finally a specific function being then executed.

BRIEF DESCRIPTION OF DRAWING

The features of the invention believed to be novel are set forth with particularity in the appended claims. The invention itself, however, may be best understood by reference to the following detailed description of the invention, which describes a number of embodiments of the invention, taken in conjunction with the accompanying drawings, in which:

DETAILED DESCRIPTION OF THE INVENTION

In cooperation with attached drawings, the technical contents and detailed description of the present invention are described thereinafter according to a number of preferable embodiments, not used to limit its executing scope. Any equivalent variation and modification made according to appended claims is all covered by the claims claimed by the present invention.

Figure 1:
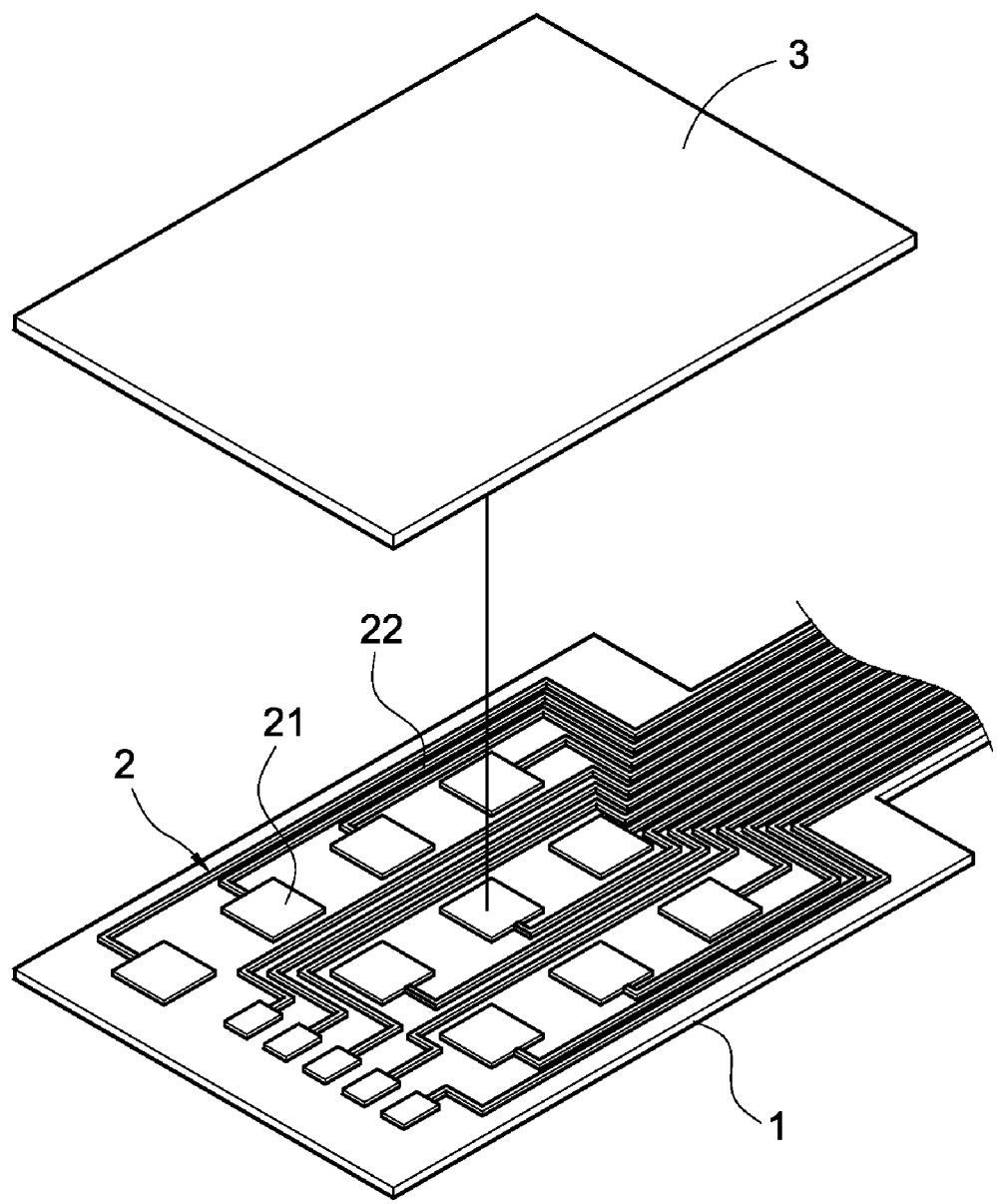
FIG. 1 is an explosive illustration of a touch-sensitive device according to the present invention.
Figure 2:
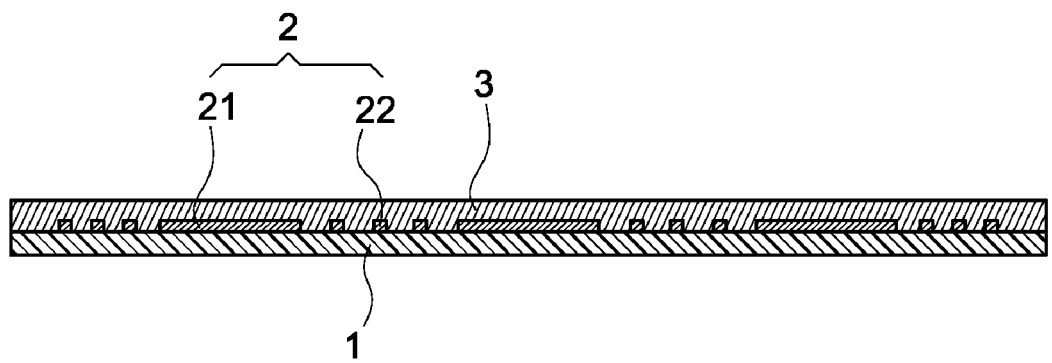
FIG. 2 is an assembled illustration viewed from one side of the touch-sensitive device according to the present invention.

Please refer to FIG. 1 and FIG. 2 respectively showing an explosive view and an assembled sectional view of a touch-sensitive device according to the invention. As shown in these two figures, the touch-sensitive device according to the invention includes a substrate 1, an inductive layer 2 and a protection layer 3.

The substrate 1 is a membrane substrate and is made of a PET material.

The inductive layer 2 is an electrically inductive ink printed on the substrate 1 via a printing technique. After printed, the electrically inductive ink is formed with a plurality of inductive sections 21 of capacitance type and at least one transmission line 22 extended from each of the inductive sections 21 (alternatively, a number of the transmission lines 22, depending on the different application requirement of different design circuit). The transmission lines 22 are electrically connected to an external driving circuit (not shown in figures).

The protection layer 3 arranged on the inductive layer 2 ensures the inductive layer 2 is not influenced by or damaged by the outside.

Figure 3:
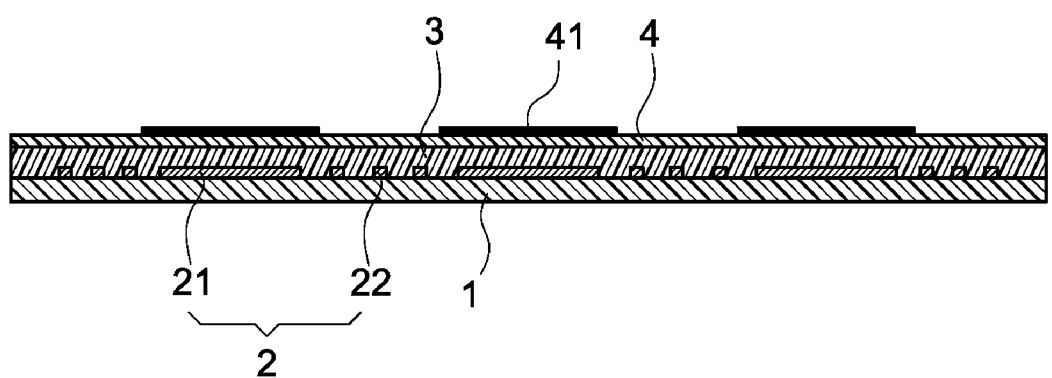
FIG. 3 is an illustration of another embodiment according to the present invention.

Please refer to FIG. 3 showing an illustration of another embodiment of the present invention. As shown in this figure, when the touch-sensitive device of the invention is under operation, it is necessary to cover or print an operational panel 4 on the protection layer 3. On the operational panel 4, there are a plurality of patterns 41, each of the plurality of patterns 41 is disposed corresponding to each inductive section 21 (or more than one inductive sections 21) of the inductive layer 2, such that an operational panel 4 is provided for an electronic object (not shown in the figures) to execute a specific function.

Figure 4:
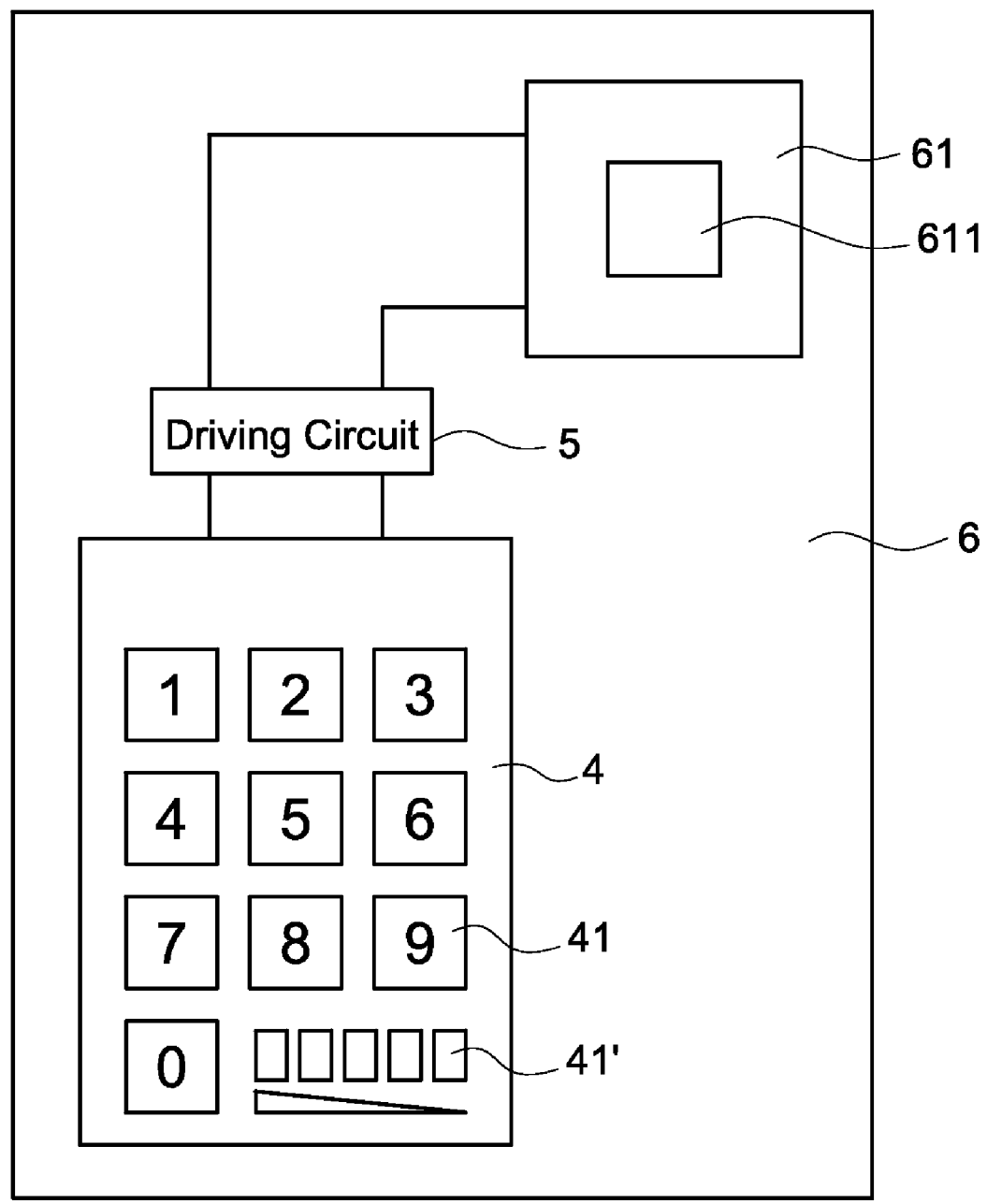
FIG. 4 is an illustration of a using status of FIG. 3.

Please refer to FIG. 4 showing an illustration of the touch-sensitive device in FIG. 3, which is under a using status. As shown in this figure, when a user's finger touches or closes to any pattern layer 41, the capacitance of the corresponding inductive section 21 of the pattern layer 41 will be changed. Consequently, a signal is output to an external driving circuit 5 via the transmission line 22. After processed by the driving circuit 5, the signal is again sent to a microprocessor 611 on a motherboard of the electronic object 6 and processed therein, such that a function is executed.

Alternatively, it is possible to continuously touch (for example, by double click) the identical pattern layer 41' or touch at least two different pattern layers 41' successively to change the magnitudes of the electronic object's sound, frequency, power, playing speed or lightness, etc.

Figure 5:
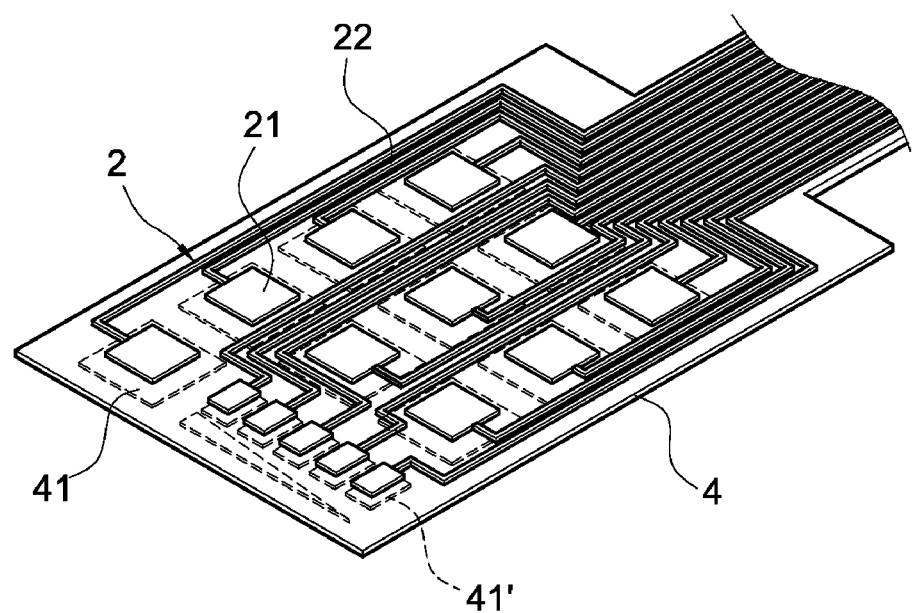
FIG. 5 is an explosive illustration of a further embodiment according to the present invention.
Figure 6:
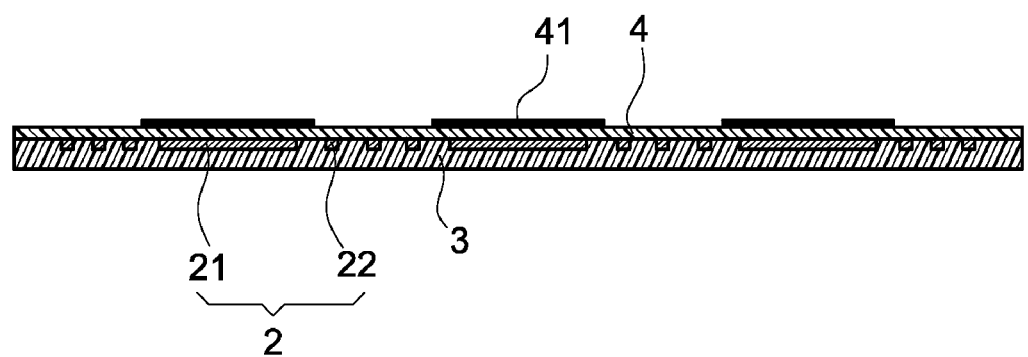
FIG. 6 is an assembled illustration viewed from one side of the touch-sensitive device of FIG. 5.

Please refer to FIGS. 5 and 6 respectively showing an explosive illustration of a further embodiment according to the present invention and an assembled illustration viewed from one side of the touch-sensitive device of FIG. 5. As shown in these two figures, a touch-sensitive device of the invention includes an operational panel 4, an inductive layer 2 and a protection layer 3.

The operational panel 4, which is made of a Polyethylene terephthalate (PET) material, and a front face of which has a plurality of pattern layers 41.

The inductive layer 2 is an electrically inductive ink printed on a back face of the operational panel 4 via a printing technique. After printed, the electrically inductive ink is formed a plurality of inductive sections 21 of capacitance type and at least more than one transmission lines 22. The transmission lines 22 are electrically connected to an external driving circuit (not shown in figures).

The protection layer 3 arranged on the inductive layer 2 ensures the inductive layer 2 is not influenced or damaged by the outside.

Figure 7:
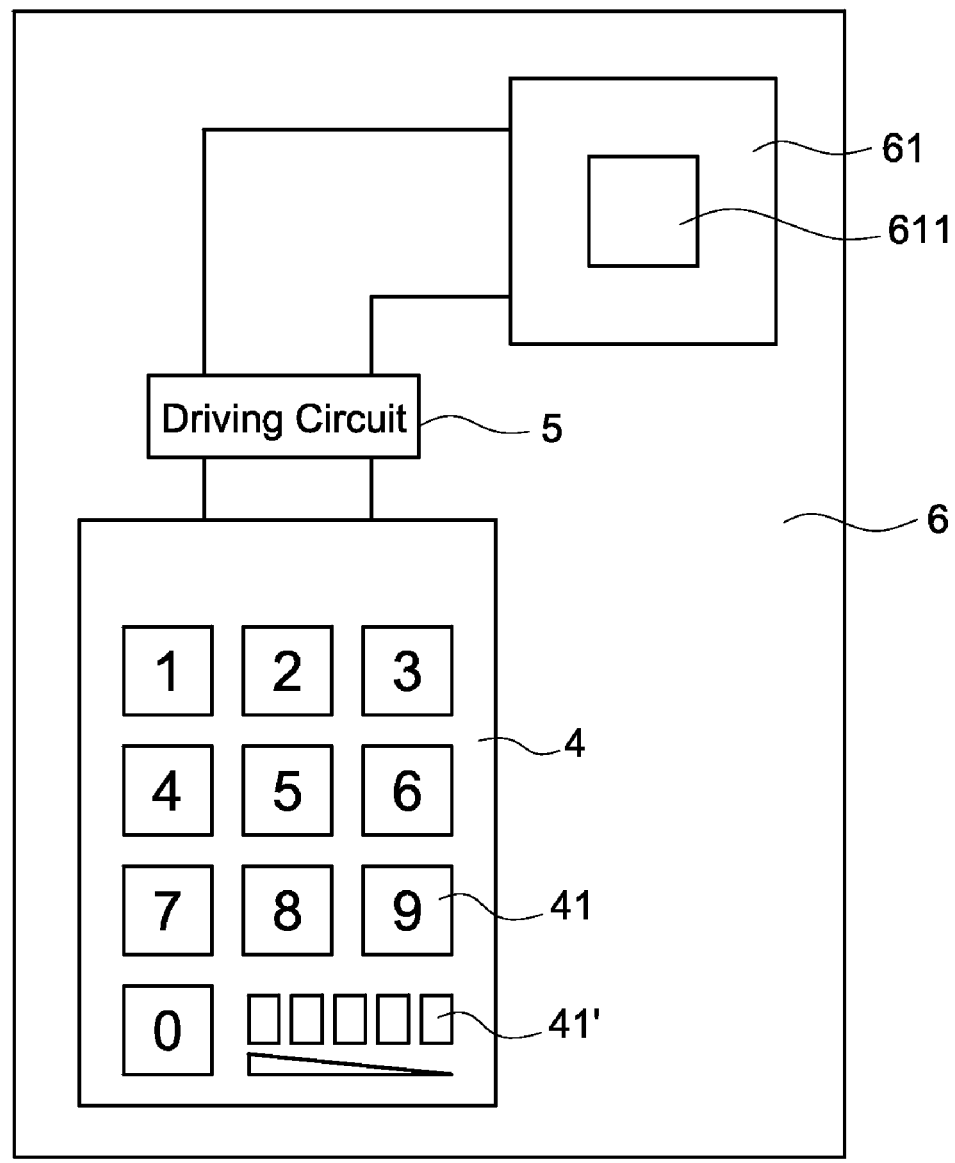
FIG. 7 is an illustration showing a using status of the touch-sensitive device of FIGS. 5 and 6.

Please refer to FIG. 7 showing an illustration of the touch-sensitive device in FIGS. 5 and 6, which is under a using status. As shown in this figure, when a user's finger touches or closes to any pattern layer 41, the capacitance of the corresponding inductive section 21 of the pattern layer 41 will be changed. Consequently, a signal is output to an external driving circuit 5 via the transmission line 22. After processed by the driving circuit 5, the signal is again sent to a microprocessor 611 on a motherboard of the electronic object 6 and processed therein, such that a function is executed.

Alternatively, it is possible to continuously touch (for example, by double click) the identical pattern layer 41' or touch at least two different pattern layers 41' successively to change the magnitudes of the electronic object's sound, frequency, power, playing speed or lightness, etc.

Accordingly, through the constitution of aforementioned assemblies, a touch-sensitive device for an electronic object according to the invention is thus obtained.

Summarizing aforementioned description, the touch-sensitive device according to the invention is an indispensable design for an electronic object indeed, which will solve the drawbacks of the prior arts, and which extremely possesses the innovation and progressiveness to fulfill the applying merits of new type patent, according to which the invention is thereby applied.

However, the aforementioned description is only a number of preferable embodiments according to the present invention, not used to limit the patent scope of the invention, so equivalently structural variation made to the contents of the present invention, for example, description and drawings, is all covered by the claims claimed thereinafter.

What is claimed is:

1. A touch-sensitive device, arranged on an electronic object and electrically connected to a driving circuit, comprising:
    a membrane substrate;
    an inductive layer, which is arranged on a front face of the membrane substrate, and which has a plurality of capacitance-inductive sections, and at least one transmission line extended from a side of each of the capacitance-inductive sections; and
    a protection layer, which is arranged on the inductive layer.

2. The touch-sensitive device according to claim 1, wherein the membrane substrate is made of a Polyethylene terephthalate (PET) material.

3. The touch-sensitive device according to claim 1, wherein the inductive layer is an electrically conductive ink.

4. The touch-sensitive device according to claim 1, wherein an operational panel is arranged on the protection layer.

5. The touch-sensitive device according to claim 4, wherein a plurality of pattern layers, corresponding to the inductive sections, are arranged on the operational layer.

6. A touch-sensitive device, arranged on an electronic object and electrically connected to a driving circuit, comprising:
    an operational panel, on a front face of which a plurality of pattern layers are arranged;
    an inductive layer, which is arranged on a back face of the operational panel, and which has a plurality of capacitance-inductive sections, and at least one transmission line extended from a side of each of the capacitance-inductive sections; and
    a protection layer, which is arranged on the inductive layer.

7. The touch-sensitive device according to claim 6, wherein the operational panel is made of a Polyethylene terephthalate (PET) material.

8. The touch-sensitive device according to claim 6, wherein the inductive layer is an electrically conductive ink.

* * * * *